(12) United States Patent
Yakuzawa et al.

(10) Patent No.: US 12,018,710 B2
(45) Date of Patent: Jun. 25, 2024

(54) ELECTRONIC CONTROL UNIT

(71) Applicant: Hitachi Automotive Systems, Ltd., Hitachinaka (JP)

(72) Inventors: Kenta Yakuzawa, Hitachinaka (JP); Toshikazu Shigyo, Hitachinaka (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 490 days.

(21) Appl. No.: 17/272,043

(22) PCT Filed: Aug. 27, 2019

(86) PCT No.: PCT/JP2019/033416
§ 371 (c)(1),
(2) Date: Feb. 26, 2021

(87) PCT Pub. No.: WO2020/050093
PCT Pub. Date: Mar. 12, 2020

(65) Prior Publication Data
US 2021/0348631 A1 Nov. 11, 2021

(30) Foreign Application Priority Data

Sep. 3, 2018 (JP) ................................ 2018-164159

(51) Int. Cl.
*F16B 5/00* (2006.01)
*C25D 5/12* (2006.01)
(Continued)

(52) U.S. Cl.
CPC .................. *F16B 5/02* (2013.01); *C25D 5/12* (2013.01); *F16J 15/14* (2013.01); *H05K 5/06* (2013.01); *H05K 2201/0999* (2013.01)

(58) Field of Classification Search
CPC ... F16B 5/02; F16B 11/006; C25D 5/12; F16J 15/14; H05K 5/06; H05K 5/0052; H05K 2201/0999; C23C 2/06; C23C 22/00
(Continued)

(56) References Cited

U.S. PATENT DOCUMENTS

2014/0076772 A1* 3/2014 Azumi ................. H05K 5/0052
206/706
2014/0085839 A1* 3/2014 Nakano .................. H05K 5/061
361/752
(Continued)

FOREIGN PATENT DOCUMENTS

| CN | 107004984 A | * | 8/2017 | ............. H01R 13/03 |
| CN | 107004984 A |  | 8/2017 | |

(Continued)

OTHER PUBLICATIONS

Chinese-language Office Action issued in Chinese Application No. 201980050489.4 dated Mar. 11, 2022 with English translation (14 pages).
(Continued)

*Primary Examiner* — Zhengfu J Feng
(74) *Attorney, Agent, or Firm* — Crowell & Moring LLP

(57) ABSTRACT

An object of the invention is to provide an electronic control unit having a structure that suppresses corrosion of plating and completely seals the substrate side under an environment where corrosion occurs. An electronic control unit 1 includes a printed wiring board 10 in which electronic components are provided, a case 20 in which the printed wiring board 10 is accommodated, and a cover 22 that is provided on the case 20. The case 20 and the cover 22 have joint surfaces that face each other and are connected via a sealing material 28. The joint surface is provided with a screw 30 that passes through the cover 22 or the case 20. A plating 24 is provided in a surface of the case 20 or the cover
(Continued)

22 that is provided with a through hole through which the screw 30 penetrates. An exposed portion 25*a* of a base material formed by partially peeling off the plating 24 presents inside the case 20 or the cover 22 and on an inner side of the case 20 from the through hole. The sealing material 28 has penetrated into the exposed portion 25*a* of the base material.

6 Claims, 8 Drawing Sheets

(51) Int. Cl.
  *F16B 5/02* (2006.01)
  *F16J 15/14* (2006.01)
  *H05K 5/06* (2006.01)
(58) Field of Classification Search
  USPC ........................................................ 361/752
  See application file for complete search history.

(56) References Cited

U.S. PATENT DOCUMENTS

| | | |
|---|---|---|
| 2015/0259127 A1 | 9/2015 | Tsukahara et al. |
| 2017/0324180 A1 | 11/2017 | Natsume et al. |
| 2017/0334375 A1 | 11/2017 | Shigyo et al. |
| 2018/0192526 A1* | 7/2018 | Suzuki ................. H05K 5/0008 |
| 2018/0222408 A1 | 8/2018 | Shigyo et al. |

FOREIGN PATENT DOCUMENTS

| | | | |
|---|---|---|---|
| JP | 55-3617 A | 1/1980 | |
| JP | 2015-174305 A | 10/2015 | |
| JP | 2017-228721 A | 12/2017 | |
| WO | WO 2016/114221 A1 | 7/2016 | |
| WO | WO 2017/038316 A1 | 3/2017 | |
| WO | WO-2017038316 A1 * | 3/2017 | ......... B60R 16/0239 |

OTHER PUBLICATIONS

International Search Report (PCT/ISA/210) issued in PCT Application No. PCT/JP2019/033416 dated Nov. 26, 2019 with English translation (four (4) pages).

Japanese-language Written Opinion (PCT/ISA/237) issued in PCT Application No. PCT/JP2019/033416 dated Nov. 26, 2019 (four (4) pages).

* cited by examiner

ELECTRONIC CONTROL UNIT

TECHNICAL FIELD

The present invention relates to an electronic control unit.

Background Art

There are many requirements for electronic control units installed in an engine room, such as waterproofing, heat resistance, corrosion resistance, and EMC. In addition, the life required of a product is also extended, and it is necessary to guarantee the operation in such a usage environment, which is difficult to be satisfied at a low price.

Further, as the functionality of the vehicle increases, the size of the control unit becomes larger, and an inexpensive and high-quality design is required. As the size increases, the number of parts to be sealed increases, and it is necessary to reduce the amount of sealing material in order to reduce the cost. In addition, the deformation of the control unit becomes larger depending on the environment (thermal deformation, altitude change, etc.), but it is necessary to reduce the stress on the sealing portion and increase the sealing length. Further, in the corrosion resistance measures of a steel plate material, it is possible to take measures using a special corrosion resistance treatment, but it is expensive because the treatment is not generally distributed in the market. It is necessary to use a proven pre-plating material without using the special corrosion resistance treatment.

CITATION LIST

Patent Literature

PTL 1: JP 2015-174305 A
PTL 2: WO2016/114221A1

SUMMARY OF INVENTION

Technical Problem

The structure disclosed in PTL 1 is a structure in which outgas during curing of the sealing material is released from a screw part, and a part around the screw part is not completely sealed. Due to the mechanism of crevice corrosion, salt water may infiltrate through the gap between the screw part of the cover and a spring washer, and may communicate and infiltrate into the contact surface between the cover and the case. The plating on the back surface side of the cover comes into contact with salt water, and the plating on the steel plate cover corrodes. Corrosion of the plating causes the sealing material to peel off, causing leaks at the screw part. In addition, in order to prevent salt water from entering from the screw part, it is generally conceivable to fill the screw with resin or use a waterproofing screw, but these are expensive due to the increase in processes and special screws that are not on the market. Thus, it is difficult to establish countermeasures. In the structure disclosed in PTL 1, it can be said that the periphery of the screw part is easily corroded and easily peeled off. An object of the invention is to provide an electronic control unit having a structure that suppresses corrosion of plating and completely seals the substrate side under an environment where corrosion occurs.

Solution to Problem

An electronic control unit includes a printed wiring board in which electronic components are provided, a case in which the printed wiring board is accommodated, and a cover that is provided on the case. The case and the cover have joint surfaces that face each other and are connected via a sealing material. The joint surface is provided with a screw that passes through the cover or the case. A plating layer is provided in a surface of the case or the cover that is provided with a through hole through which the screw penetrates. An exposed portion of a base material formed by partially peeling off the plating layer presents inside the case or the cover and on an inner side of the case from the through hole. The sealing material has penetrated into the exposed portion of the base material.

Advantageous Effects of Invention

According to the invention, the surface of a cover is plated to improve corrosion resistance, and a place where the plating is cracked gets wet with an adhesive to prevent plating corrosion. Effects and objects other than those described above will be clarified by the following embodiments.

DESCRIPTION OF EMBODIMENTS

Figure 1:
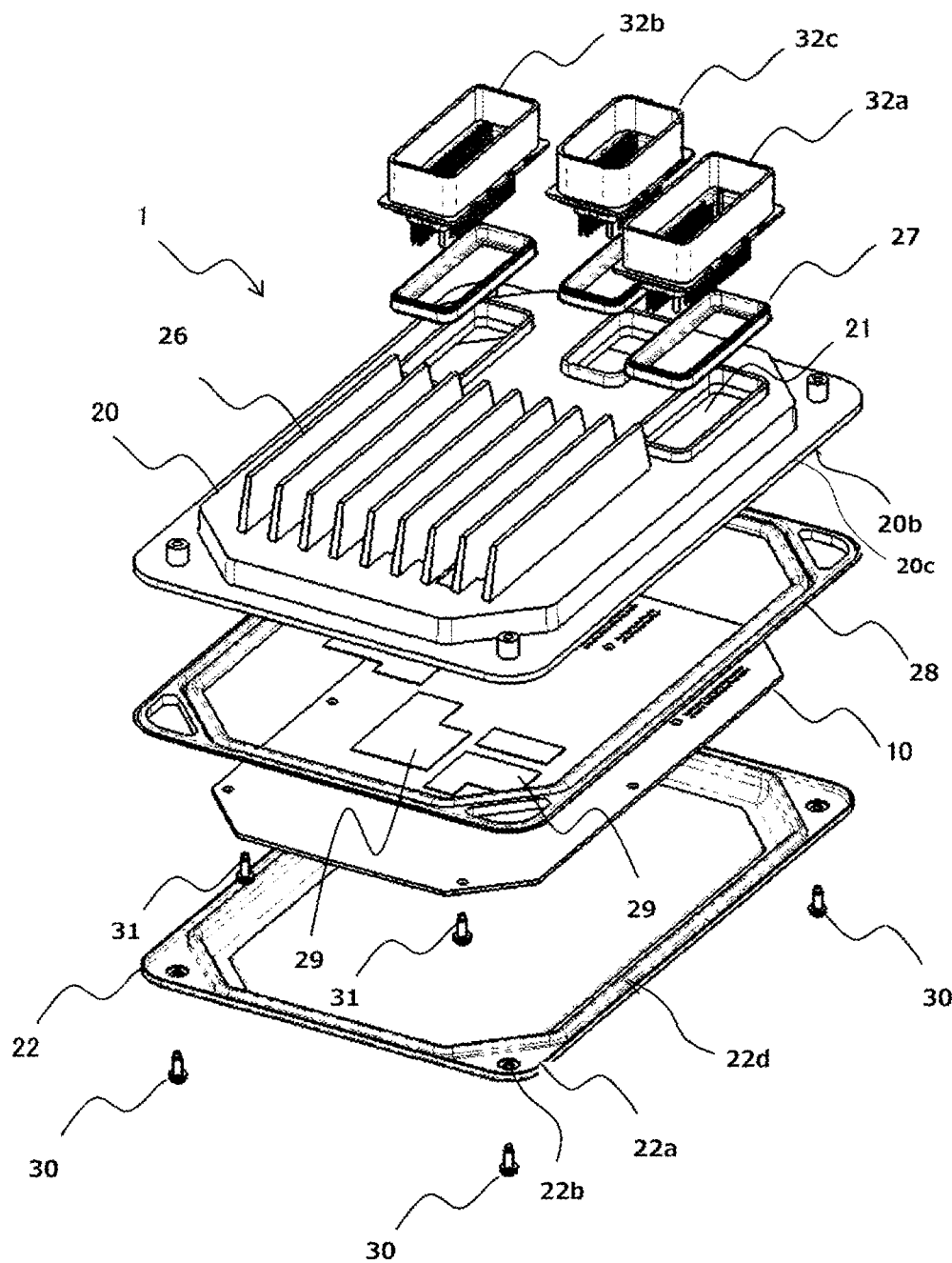
FIG. 1 is a perspective view of an electronic control unit according to a first embodiment of the invention.

Hereinafter, the configuration and operational effects of an electronic control unit according to the first to sixth embodiments of the invention will be described with reference to the drawings. The electronic control unit controls, for example, an engine, a transmission, and the like. Further, the same symbols in the drawings indicate the same portion.

First Embodiment

FIG. 1 is a perspective view of an electronic control unit 1 according to the first embodiment of the invention. The electronic components mounted on the board are omitted in order to make the drawings easier to see.

As illustrated in FIG. 1, the electronic control unit 1 mainly includes a printed wiring board 10, a case 20, a cover 22, and three connectors 32.

Electronic components and the like are mounted on the printed wiring board 10. The case 22 protects the printed wiring board 10. In the case 20, the cover 22 provided with at least three frontages 21 on a flat surface to insert the connector 32 is fixed to the case 20 to seal an opening 20b of the case 20. The connector 32 is electrically connected to the printed wiring board 10. The sealing material 28 waterproofs between an opening edge 20c of the case 20 and the inner surface of a peripheral edge 22d of the cover 22. The sealing material 28 waterproofs between a housing groove 32d of the connector 32 and the protrusions around the plurality of frontages through which the case 20 penetrates.

The printed wiring board 10 is fixed to the case 20 with screws 31. Here, a heat-dissipating adhesive 29 is interposed between the printed wiring board 10 and the case 20. The cover 22 is fixed to the case 20 with screws 30.

The case 20 together with the cover 22 accommodates the printed wiring board 10 inside, and protects the printed wiring board 10 mounted with electronic components from water, foreign matter, and the like. In the case 20, metal is preferable, and aluminum is suitable in order to dissipate heat generated by electronic components and to shield noises. The case 20 is molded by an aluminum die-cast molding method using a mold.

In the case of the electronic control unit 1 composed of electronic components that do not require heat dissipation or shielding, resin may be used for the material of the case 20. In the case of resin, the case 20 is molded by an injection molding method.

As illustrated in the drawing, the outer shape of the case 20 is 240 mm×160 mm, which is relatively large in the electronic control unit 1 arranged in the engine room, and has a rectangular shape.

As illustrated in the drawing, the peripheral edge 22d is provided on the entire circumference inside the cover 22. The sealing material 28 is applied between the peripheral edge 22d of the cover 22 and the opening edge 20c of the case 20 to protect the electronic components from foreign matter such as salt water.

The material of the cover 22 is preferably an iron-based or aluminum-based steel plate, but resin or aluminum die-casting may also be used. Metal is less affected by electromagnetic waves. In addition, it is less affected by electromagnetic waves than others.

The sealing material 28 is preferably a silicone adhesive. In particular, the long side of the case 20 is deformed so that the center of the case 20 is curved outward due to the internal pressure applied to the case 20 due to the pressure change in the case 20 due to the temperature change, so that the center of the long side of the case 20 is most deformed. Therefore, the sealing material 28 has an adhesive force that can withstand deformation.

The cover 22 is provided with cover through holes 22b at the four corners through which the screws 30 for fixing the case 20 are penetrated. The cover 22 and the case 20 are fixed by the screws 30 together with the sealing material 28. It is desirable to arrange the screws 30 at the four corners of the cover 22 so that the coating locus of the sealing material 28 is not complicated. In this embodiment, since the size is 1.5 times larger than that of the conventional electronic control unit 1, a thin material is selected for the cover 22, and ribs, dimples, steps, and the like are provided to ensure the strength.

Figure 2:
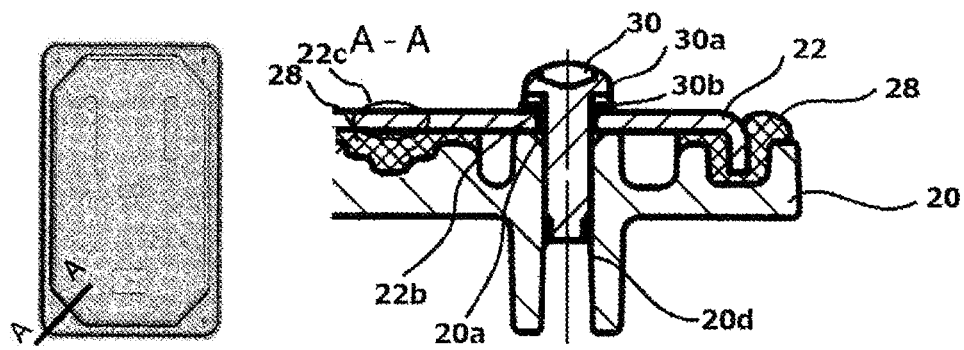
FIG. 2 is a cross-sectional view illustrating main parts of the electronic control unit according to the first embodiment of the invention.

FIG. 2 is a cross-sectional view illustrating main parts of the electronic control unit 1 according to the first embodiment of the invention.

In order to fit the case 20 and the cover 22, the screw 30 passes through a case through hole 20d and the cover through hole 22b provided respectively. A spring washer 30a and a flat washer 30b are sandwiched between the screws 30 to prevent loosening. In order to discharge the outgas generated when the sealing material 28 is cured, the case through hole 20d and the cover through hole 22b are provided with an outgas discharge portion 20a.

Since salt water infiltrates from the outgas discharge portion 20a, the sealing material 28 is provided on an inside 22c of the cover on the closed space side from the cover through hole to prevent the infiltration of salt water.

Figure 3:
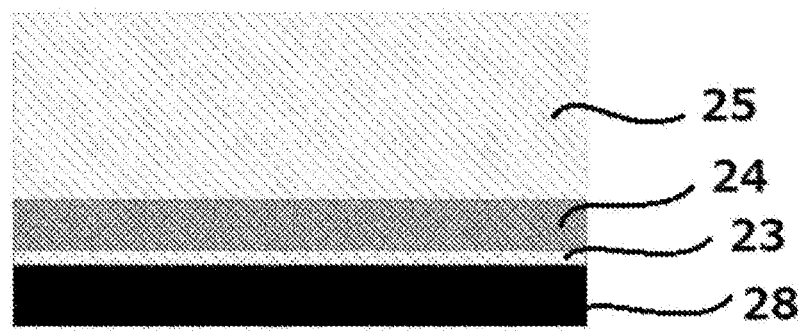
FIG. 3 is a cross-sectional view illustrating main parts of a cover of the electronic control unit according to the first embodiment of the invention.

FIG. 3 is a cross-sectional view illustrating main parts of the cover 22 of the electronic control unit 1 according to the first embodiment of the invention. The cover 22 is a cover base material 25 coated with plating 24 having a thickness of about several tens of um.

Further, in order to prevent oxidation of the plating 24, a chemical conversion treatment 23 having a thickness of about several um is applied to the surface of the plating 24. The plating 24 is mainly composed of hot-dip zinc and contains many impurities such as aluminum, magnesium, and silicon. The thicker the plating thickness, the more easily plating cracks occur. The cover base material 25 is a rolled iron-based material.

Figure 4:
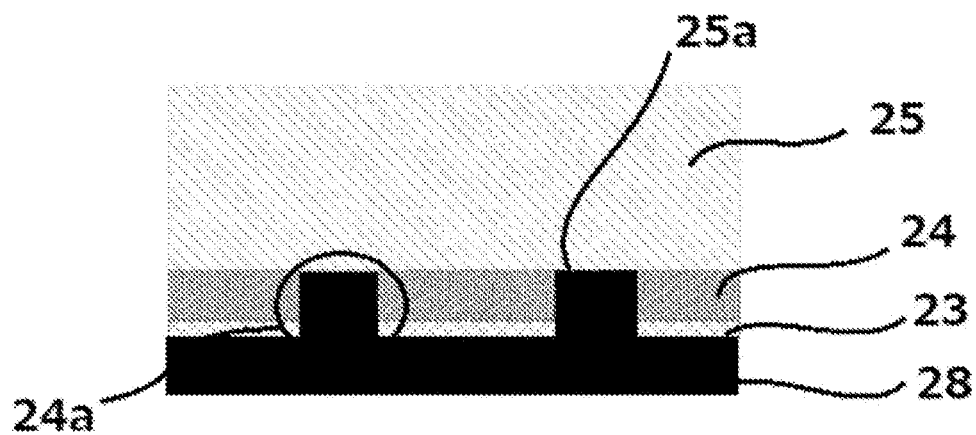
FIG. 4 is a cross-sectional view illustrating main parts of the cover of the electronic control unit according to the first embodiment of the invention, and is a diagram for explaining plating cracking.

FIG. 4 is a cross-sectional view illustrating main parts of the cover 22 of the electronic control unit 1 according to the first embodiment of the invention, and is a diagram for explaining a plating crack 24a. The cover 22 illustrated in FIG. 3 is formed with plating cracks 24a by molding or the like, and an exposed portion 25a of the base material is provided. In addition, the sealing material 28 gets wet on the exposed portion.

Figure 5:
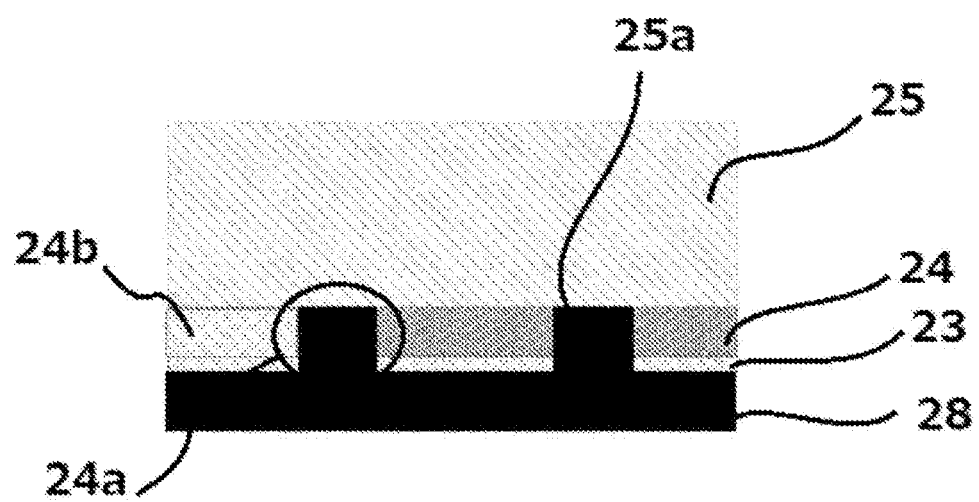
FIG. 5 is a cross-sectional view illustrating main parts of the cover of the electronic control unit according to the first embodiment of the invention, and is a diagram for explaining the effect of the invention.

FIG. 5 is a cross-sectional view illustrating main parts of the cover 22 of the electronic control unit 1 according to the first embodiment of the invention, and is a diagram for explaining the effect of the invention. When the sealing material 28 gets wet with the exposed portion 25a of the base material generated by molding or the like, a plating corrosion 24b stops at the place where the sealing material 28 is wet, and leakage can be prevented. In general, zinc in the plating 24 is more easily corroded than iron, and it is known that zinc is preferentially corroded to prevent iron corrosion.

Figure 6:
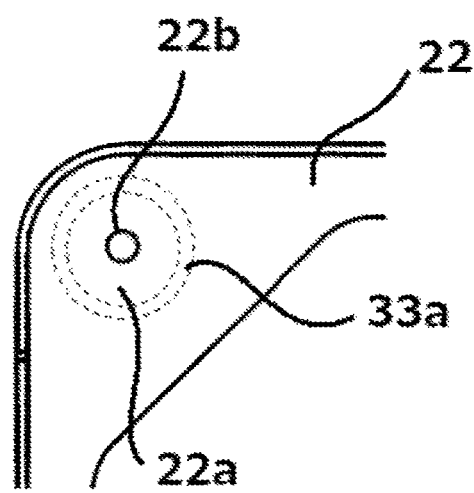
FIG. 6 is a front view illustrating main parts of the cover of the electronic control unit according to the first embodiment of the invention.

FIG. 6 is a front view illustrating main parts of the cover 22 of the electronic control unit 1 according to the first embodiment of the invention.

A throttle portion 33a is provided around a contact portion 22a between the inside of the cover and a case pedestal in order to intentionally generate plating cracks 24a.

Figure 7:
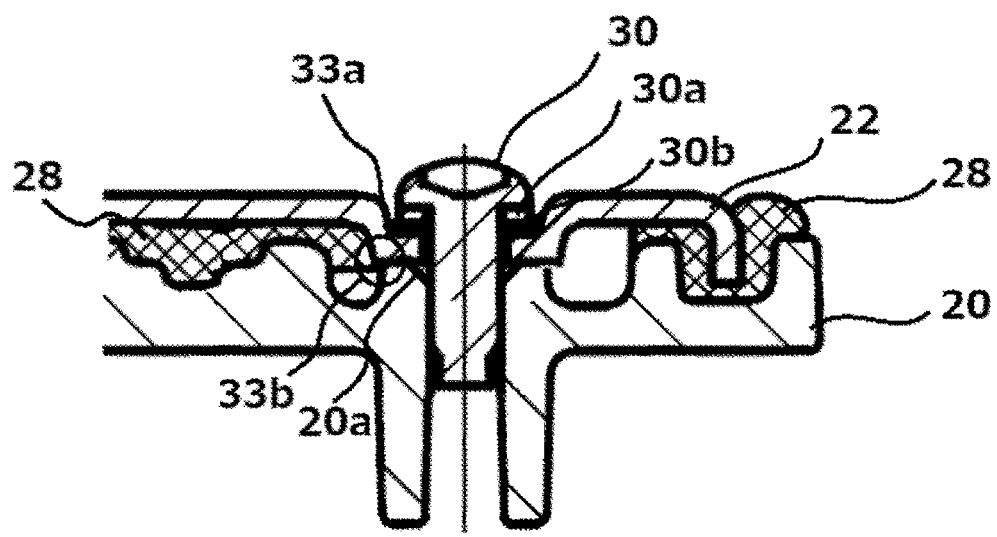
FIG. 7 is a cross-sectional view illustrating main parts of the cover of the electronic control unit according to the first embodiment of the invention.

FIG. 7 is a cross-sectional view illustrating main parts of the cover 22 of the electronic control unit 1 according to the first embodiment of the invention. As illustrated in FIG. 6, a processing portion 33 is provided near the contact portion 22a between the inside of the cover and the case pedestal to generate the plating crack 24a that exposes the base material. By providing the throttle portion 33a near the contact portion 22a between the inside of the cover and the case pedestal in order to generate the plating crack 24a, a plating crack 33b is generated in a place of the throttle portion. The plating crack 24a exposes the base material and wets the sealing material 28, which delays the corrosion 24b of the plating. Further, by providing the plating crack 24a near the contact portion 22a between the inside of the cover and the case pedestal, the plating corrosion 24b starting from the cover through hole 22b can be delayed.

According to this embodiment, it is possible to improve the corrosion resistance of the cover of the electronic control unit 1 which has become larger due to the higher functionality.

Second Embodiment

Figure 8:
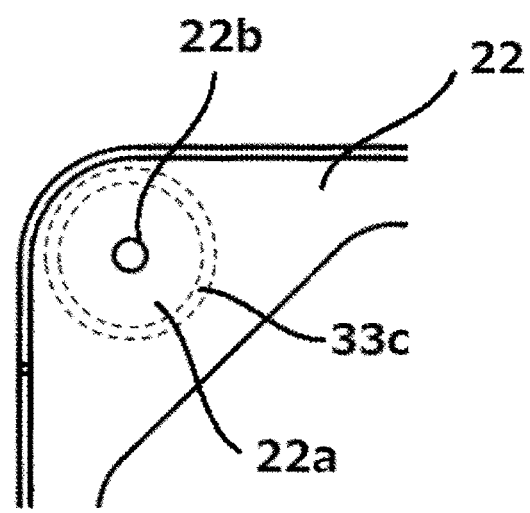
FIG. 8 is a front view illustrating main parts of the cover of the electronic control unit according to a second embodiment of the invention.

FIG. 8 is a front view illustrating main parts of the cover 22 of the electronic control unit 1 according to the second embodiment of the invention.

A circular groove 33c is provided around the contact portion 22a between the inside of the cover and the case pedestal in order to intentionally generate the plating crack 24a.

Figure 9:
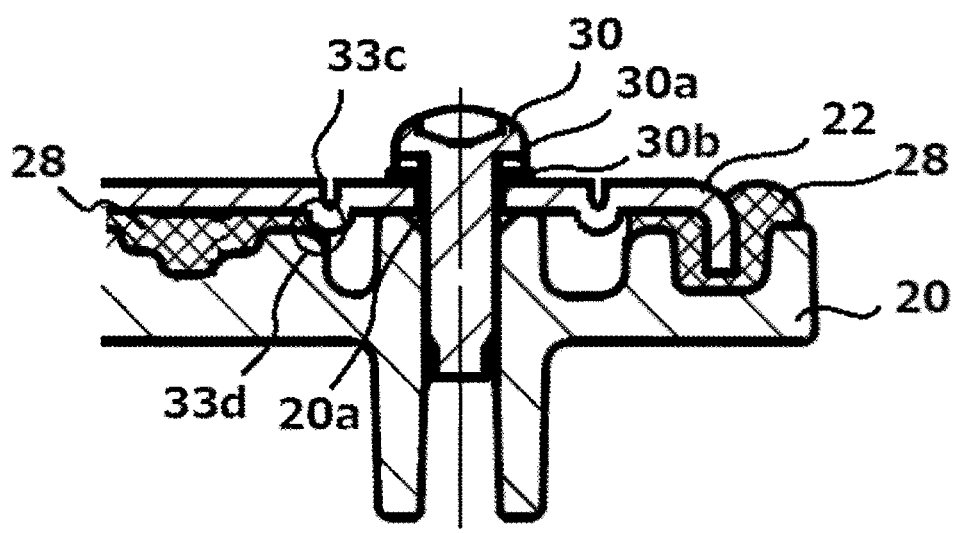
FIG. 9 is a cross-sectional view illustrating main parts of the cover of the electronic control unit according to the second embodiment of the invention.

FIG. 9 is a cross-sectional view illustrating main parts of the cover 22 of the electronic control unit 1 according to the second embodiment of the invention. As illustrated in FIG. 8, the processing portion 33 is provided near the contact portion 22c the inside of the cover and the case pedestal to generate the plating crack 24a that exposes the base material. By providing the circular groove 33c near the contact portion 22a between the inside of the cover and the case pedestal in order to generate the plating crack 24a, a plating crack 33d is generated in a place of the circular groove. The plating crack 24a exposes the base material and wets the sealing material 28, which delays the corrosion 24b of the plating.

According to this embodiment, it is possible to improve the corrosion resistance of the cover of the electronic control unit 1 which has become larger due to the higher functionality.

Third Embodiment

Figure 10:
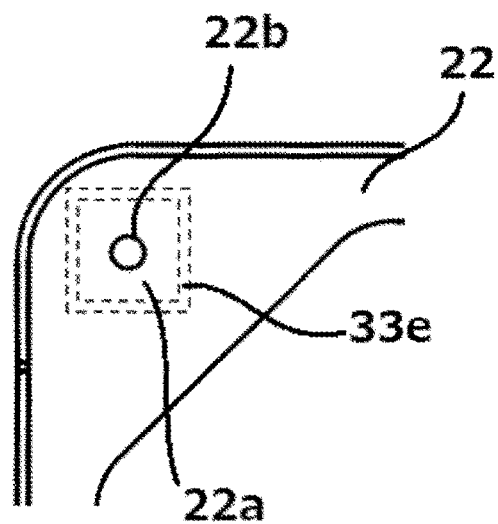
FIG. 10 is a front view illustrating main parts of the cover of the electronic control unit according to a third embodiment of the invention.

FIG. 10 is a front view illustrating main parts of the cover 22 of the electronic control unit 1 according to the third embodiment of the invention.

A triangular groove 33e is provided around the contact portion 22a between the inside of the cover and the case pedestal in order to intentionally generate plating cracks 24a.

Figure 11:
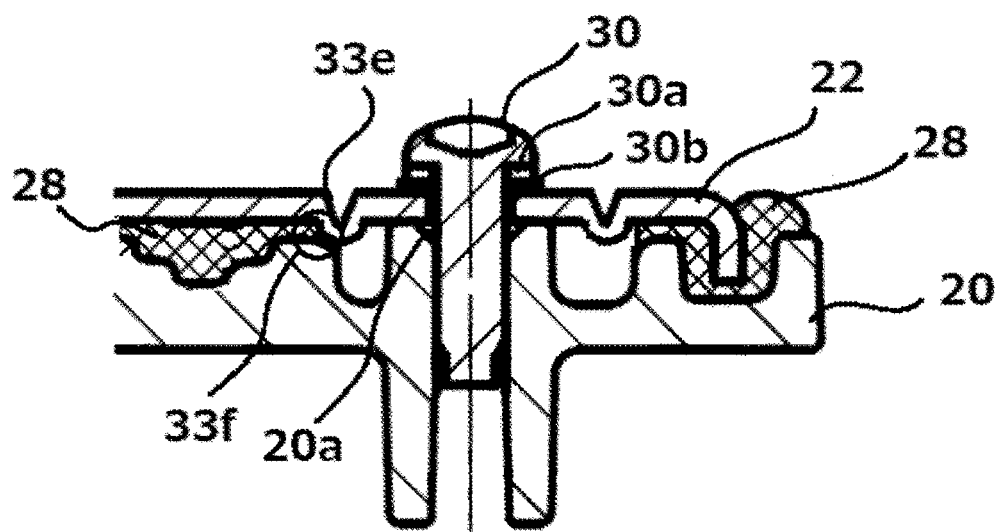
FIG. 11 is cross-sectional view illustrating main parts of the cover of the electronic control unit according to the third embodiment of the invention.

FIG. 11 is a cross-sectional view illustrating main parts of the cover 22 of the electronic control unit 1 according to the second embodiment of the invention. As illustrated in FIG. 8, the processing portion 33 is provided near the contact portion 22c the inside of the cover and the case pedestal to generate the plating crack 24a that exposes the base material. By providing a triangular groove 33c near the contact portion 22a between the inside of the cover and the case pedestal in order to generate the plating crack 24a, a plating crack 33f is generated in a place of the triangular groove. The plating crack 24a exposes the base material and wets the sealing material 28, which delays the corrosion 24b of the plating.

According to this embodiment, it is possible to improve the corrosion resistance of the cover of the electronic control unit 1 which has become larger due to the higher functionality.

Fourth Embodiment

Figure 12:
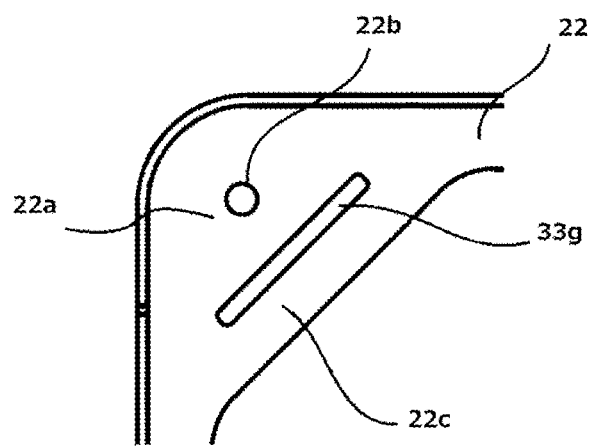
FIG. 12 is a front view illustrating main parts of the cover of the electronic control unit according to a fourth embodiment of the invention.

FIG. 12 is a front view illustrating main parts of the cover 22 of the electronic control unit 1 according to the fourth embodiment of the invention. In order to intentionally generate plating cracks 24a, a beading portion 33g is provided in the inside 22c of the cover on the closed space side of the cover through hole.

Figure 13:
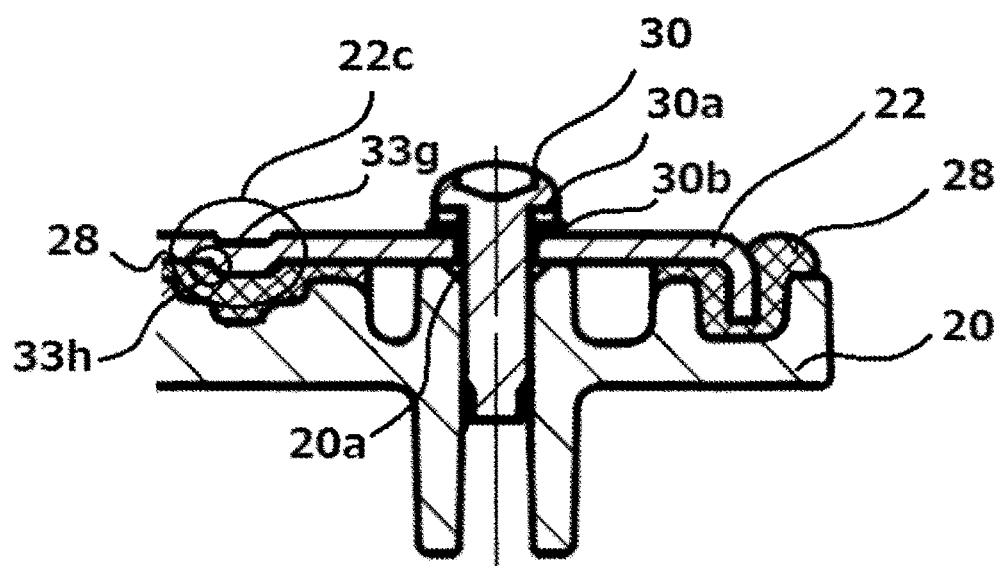
FIG. 13 is a cross-sectional view illustrating main parts of the cover of the electronic control unit according to the fourth embodiment of the invention.

FIG. 13 is a cross-sectional view illustrating main parts of the cover of the electronic control unit according to the fourth embodiment of the invention.

The beading portion 33g is provided on the inside 22c of the cover on the closed space side from the cover through hole to generate the plating crack 24a that exposes the base material. Plating cracks 33h occur in a place of the beading portion. The plating crack 24a exposes the base material and wets the sealing material 28, which delays the corrosion 24b of the plating. Since the beading portion 33g can be processed on a flat portion of the cover, the beading portion 33g can be freely moved. By providing the beading portion 33g on the inside 22c of the cover on the closed space side from the cover through hole, it is effective for the plating corrosion 24b that has advanced to the inside 22c of the cover on the closed space side from the cover through hole. Further, by providing the processing portion 33 near the contact portion 22c between the inside of the cover and the case pedestal and on the inside 22c of the cover on the closed space side from the cover through hole, the plating corrosion 24b can be delayed at a plurality of places. It is best for the plating corrosion 24b to provide a processed portion.

According to this embodiment, it is possible to improve the corrosion resistance of the cover of the electronic control unit 1 which has become larger due to the higher functionality.

Fifth Embodiment

Figure 14:
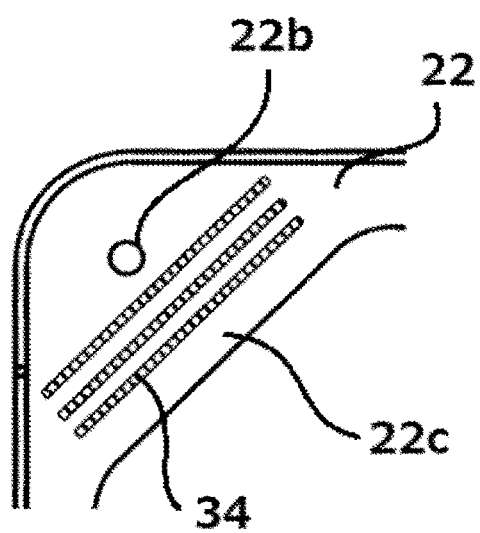
FIG. 14 is a front view illustrating main parts of the cover of the electronic control unit according to a fifth embodiment of the invention.

FIG. 14 is a front view illustrating main parts of the cover 22 of the electronic control unit 1 according to the fifth embodiment of the invention. The corrosion resistance is improved by the sealing material 28 getting wet with the exposed portion 25a of the base material due to the plating crack 24a by processing, but the same effect can be obtained by treating the cover surface in addition to exposing the base material by processing.

As illustrated in FIG. 14, the plating 24 is removed by a marking-off treatment 34a with lines which are provided in the cover 22 and have several mm in width on the plating surface of the inside 22c of the cover on the closed space side from the cover through hole, so that the base material is exposed, and the sealing material 28 gets wet in a place where the base material is exposed. Therefore, it is possible to delay the corrosion 24b of the plating.

Sixth Embodiment

Figure 15:
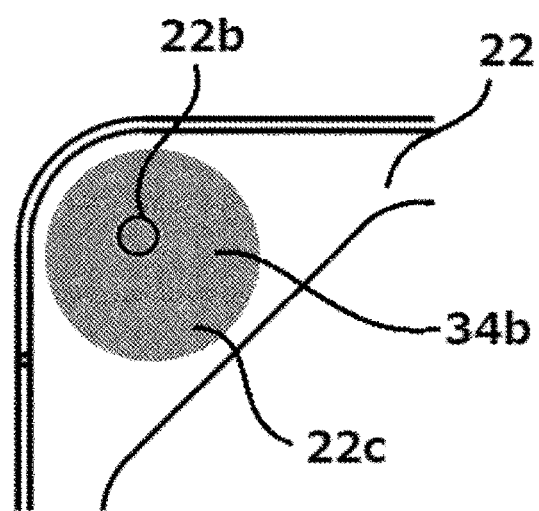
FIG. 15 is a front view illustrating main parts of the cover of the electronic control unit according to a sixth embodiment of the invention.

FIG. 15 is a front view illustrating main parts of the cover 22 of the electronic control unit 1 according to the sixth embodiment of the invention. As illustrated in FIG. 15, the plating 24 is removed by a sanding treatment 34b with lines which are provided in the cover 22 on the plating surface of the inside 22c of the cover on the closed space side from the cover through hole, so that the base material is exposed, and the sealing material 28 gets wet in a place where the base material is exposed. Therefore, it is possible to delay the corrosion 24b of the plating.

REFERENCE SIGNS LIST 1 electronic control unit
10 printed wiring board
20 case
20a outgas discharge portion
20b opening
20c opening edge
20d case through hole
21 frontage
22 cover
22a contact portion between the inside of cover and case pedestal
22b cover through hole
22c inside of cover on closed space side from cover through hole
22d peripheral edge
23 chemical conversion treatment
24 plating
24a plating crack
24b plating corrosion
25 cover base material
25a exposed portion of base material
26 heat-dissipating fin
27 sealing material
28 sealing material
29 heat-dissipating adhesive
30 screw
30a spring washer
30b flat washer
31 screw
32 connector
32a first connector
32b second connector
32c third connector
32d housing groove
33 processing portion
33a throttle portion
33b plating cracks in a place of the throttle portion
33c circular groove
33d plating cracks in a place of the circular groove
33e triangular groove
33f plating cracks in a place of the triangular groove
33g beading portion
33h plating cracks in a place of the beading portion
34 plating surface treatment portion
34a marking-off treatment
34b sanding treatment

The invention claimed is:

1. An electronic control unit comprising:
a printed wiring board in which electronic components are provided;
a base material;
a case in which the printed wiring board is accommodated; and
a cover that is provided on the case,
wherein the case and the cover have joint surfaces that face each other and are connected via an adhesive,
each joint surface is provided with a screw that passes through the cover or the case,
a plating layer is provided in a surface of the case or the cover that is provided with a through hole through which the screw penetrates,
the plating layer includes a peeled off portion that forms an exposed portion of the base material, the peeled off portion being formed inside the case or the cover and on an inner side of the case from the through hole, and
a sealing material penetrates into the exposed portion of the base material.

2. The electronic control unit according to claim 1, wherein
the peeled off portion is formed by providing a processing portion inside the cover.

3. The electronic control unit according to claim 1, wherein
the exposed portion of the base material formed by partially peeling the plating layer by performing a beading process on an inner side of the case of a contact surface between an inside of the cover and a case pedestal.

4. The electronic control unit according to claim 1, wherein
the exposed portion of the base material formed by partially peeling the plating layer by performing a process for plating cracks inside the cover.

5. The electronic control unit according to claim 1, wherein
the exposed portion of the base material formed by partially peeling the plating layer by performing a marking-off process for removing plating on an inner side of the case of a contact surface between an inside of the cover and a case pedestal.

6. The electronic control unit according to claim 1, wherein the exposed portion of the base material formed by partially peeling the plating layer by performing a sanding process for removing plating on an inner side of the case of a contact surface between an inside of the cover and a case pedestal.

* * * * *